United States Patent
Katsuyama et al.

(10) Patent No.: US 7,791,300 B2
(45) Date of Patent: Sep. 7, 2010

(54) EXCESSIVE TEMPERATURE DETECTING SYSTEM OF ELECTRIC MOTOR CONTROLLER

(75) Inventors: Yuji Katsuyama, Tokyo (JP); Shigeru Kojima, Tokyo (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 469 days.

(21) Appl. No.: 11/817,446

(22) PCT Filed: Sep. 21, 2005

(86) PCT No.: PCT/JP2005/017395

§ 371 (c)(1), (2), (4) Date: Aug. 30, 2007

(87) PCT Pub. No.: WO2007/034544

PCT Pub. Date: Mar. 29, 2007

(65) Prior Publication Data

US 2009/0051307 A1    Feb. 26, 2009

(51) Int. Cl.
*H02P 3/00* (2006.01)
(52) U.S. Cl. .............. 318/471; 318/139; 318/432; 388/923; 388/934
(58) Field of Classification Search .......... 318/139, 318/432, 471, 798, 801, 805; 388/923, 934
See application file for complete search history.

(56) References Cited

U.S. PATENT DOCUMENTS 5,712,802 A * 1/1998 Kumar et al. ............. 702/132
5,923,135 A * 7/1999 Takeda .................... 318/432
6,203,191 B1 * 3/2001 Mongan ................... 374/43
7,071,649 B2 * 7/2006 Shafer et al. ............. 318/783

FOREIGN PATENT DOCUMENTS

| JP | 2003-134839 A | 5/2003 |
| JP | 2004-096318 A | 3/2004 |
| JP | 2005-124387 A | 5/2005 |
| JP | 2005-143232 A | 6/2005 |

OTHER PUBLICATIONS

Form PCT/ISA/210 (International Search Report) dated Nov. 15, 2005.

* cited by examiner

*Primary Examiner*—Rina I Duda
(74) *Attorney, Agent, or Firm*—Buchanan Ingersoll & Rooney PC

(57) ABSTRACT

An electric motor controller for a vehicle has a voltage detecting section for detecting the voltage of a filter capacitor inserted on a direct current side of an inverter device including a semiconductor element for large electric power; an electric current detecting section for detecting an output electric current of the inverter device; and a temperature detecting section arranged in a cooling means of the semiconductor element for large electric power. Loss generated by a switching operation of the semiconductor element for large electric power is sequentially calculated by outputs of the detecting sections. Excessive temperature is detected when junction temperature of the large electric power semiconductor element calculated by this loss reaches an allowable temperature.

5 Claims, 7 Drawing Sheets

EXCESSIVE TEMPERATURE DETECTING SYSTEM OF ELECTRIC MOTOR CONTROLLER

TECHNICAL FIELD

This invention relates to an excessive temperature detecting system of an electric motor controller using a large electric power semiconductor element.

BACKGROUND ART

In recent years, in electric motor control for a railway vehicle, an electrically driven automobile, etc., a desirable electric power control for the system is, in most case, performed by an inverter device using the large electric power semiconductor element.

In many cases, an intelligent power module (IPM) having an excessive temperature protecting function is used in the semiconductor element for large electric power used in such electric power control to prevent breakdown due to overheating. With respect to the excessive temperature protecting function of this IPM, for example, as shown in JP-A-2004-96318 (patent literature 1), there is a structure having a temperature detector and a switching speed variable circuit. The temperature detector detects the temperature of the vicinity of an IGBT chip of the semiconductor element for large electric power, and a diode chip. The switching speed variable circuit changes a switching speed in accordance with this temperature with respect to each of the above chips. When the temperature of each of the above chips exceeds a predetermined level, the switching speed of the chip is changed to prevent an excessive rise in temperature.

FIG. 10 shows one example of an internal structural view of the above intelligent power module (IPM). In this figure, an IGBT chip, a diode chip 21 and a temperature sensor 22 are arranged on an insulating substrate 20, and this insulating substrate 20 is arranged on a base plate 23. On the other hand, a control substrate 24 is arranged above the insulating substrate 20, and a gate drive circuit 25 required in switching of IGBT is mounted to this control substrate 24. The outer circumference of all these parts is covered with a case 26. A main circuit terminal 27 for flowing an electric current to IGBT and the diode, and a control circuit terminal 28 for transmitting a control signal required in the switching of IGBT are set to a structure guided from the above case 26 to the exterior.

As can be seen from the above structure, in IPM using the semiconductor element for large electric power, the temperature sensor 18 is arranged near IGBT and the diode chip, and junction temperatures of IGBT and the diode are presumed by detecting temperatures near the IGBT chip of the semiconductor element for large electric power and the diode chip. Accordingly, no junction temperatures of IGBT and the diode themselves are measured.

Patent literature 1: JP-A-2004-96318

DISCLOSURE OF THE INVENTION

Problems that the Invention is to Solve

However, a judgment as to whether the semiconductor element for large electric power is broken by overheating is determined by the junction temperature. Therefore, it is necessary to arrange a temperature sensor in a junction portion (joining portion) of a semiconductor chip portion so as to accurately detect the excessive temperature of the semiconductor element for large electric power. However, because the semiconductor chip of the semiconductor element for large electric power is at a high potential, it is necessary to perform insulation to arrange the temperature sensor. Accordingly, it becomes a very complicated and expensive structure and causes to impractical.

An object of this invention is to provide an excessive temperature detecting system capable of more accurately detecting the excessive temperature by grasping the junction temperature itself without separately arranging the temperature sensor in the junction portion (joining portion).

Means for Solving the Problems

An excessive temperature detecting system of an electric motor controller of this invention is constructed by an inverter device for controlling driving electric power supplied to an electric motor arranged in a vehicle by controlling the operation of a semiconductor element for large electric power; a voltage detecting section for detecting the voltage of a filter capacitor inserted on a direct current side of the inverter device; an electric current detecting section for detecting an output current of the inverter device; a temperature detecting section arranged in cooling means of the semiconductor element for large electric power; a junction temperature calculating section for sequentially calculating loss caused by a switching operation of the semiconductor element for large electric power by a detecting signal from each of the detecting sections, and calculating junction temperature of the semiconductor element for large electric power on the basis of this calculated loss value; and a comparing section for generating an excessive temperature detecting output when an output of the junction temperature calculating section reaches a predetermined allowable temperature.

EFFECT OF THE INVENTION

In the excessive temperature detecting system of the controller for the electric motor in this invention, loss generated by the switching operation of the semiconductor element for large electric power is sequentially calculated. Excessive temperature can be detected when junction temperature (joining portion temperature) of the large electric power semiconductor element calculated by this loss reaches an allowable temperature. Accordingly, this invention has an effect able to accurately detect the excessive temperature without directly arranging a temperature sensor in a junction portion.

BEST MODE FOR CARRYING OUT THE INVENTION

Embodiment 1

Figure 1:
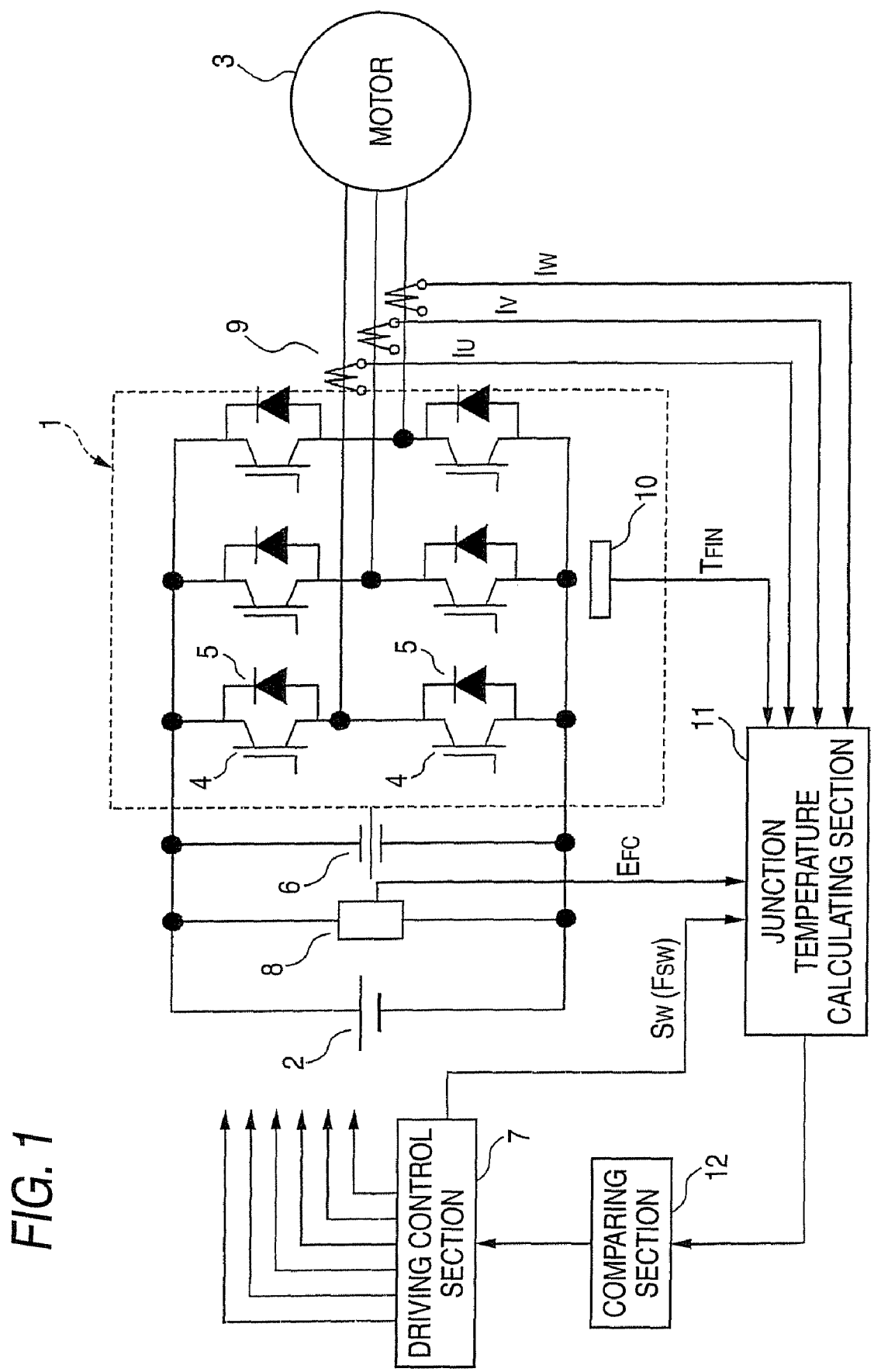
FIG. 1 is a system construction view of a controller for a vehicle in accordance with the embodiment mode of this invention.

FIG. 1 shows a system construction view of an electric motor controller in accordance with embodiment 1 of this invention. In FIG. 1, reference numeral 1 designates an inverter device for converting direct current power supplied from a direct current power source 2 into alternating current electric power, and supplying this alternating current power to an electric motor 3. The inverter device 1 is constructed by six large electric power semiconductor elements 4, e.g., gate insulating type bipolar transistors (IGBTs) and a diode 5 connected to each of the large electric power semiconductor element in inverse parallel. Switching of the above IGBT is controlled by a driving control section 7. A filter capacitor 6 is inserted between the direct current electric power source 2 and the inverter device 1. The voltage of the filter capacitor 6 is detected by a voltage detecting section 8. Further, an electric current flowed to the large electric power semiconductor element 4 is detected by an electric current detecting section 9.

In an unillustrated cooling means such as a cooling fin, etc. for cooling the large electric power semiconductor element, a temperature detecting section 10 is arranged to detect the temperature of the cooling means. Information from the voltage detecting section 8, the electric current detecting section 9 and the temperature detecting section 10 is inputted to a junction temperature calculating section 11. The junction temperature calculating section 11 fetches the above information, and calculates junction temperature by a method explained in detail below. The information of the junction temperature calculated by this junction temperature calculating section 11 and an allowable temperature (reference temperature) are compared in a comparing section 12. Information from the comparing section 12 is inputted to the driving control section 7, and output power of the above inverter device 1 is controlled by an output signal of this driving control section 7.

Further, a signal of this driving control section 7 is also transmitted to the junction temperature calculating section 11 so as to calculate the junction temperature. In addition, the electric motor 3 denotes a power source for driving a railway vehicle, an electric drive automobile, etc.

In the electric motor controller constructed as shown in FIG. 1, signals (Iu, Iv, Iw) from the electric current detecting section 9, a temperature signal ($T_{FIN}$) of the cooling fin of the temperature detecting section 10, a filter capacitor voltage $E_{FC}$ of the voltage detecting section 8, a signal (Sw) showing a switching state of the large electric power semiconductor element from the driving control section 7, and an output frequency (Fsw) are inputted to the junction temperature calculating section 11 so as to calculate the junction temperature.

A mechanism for generating loss in the large electric power semiconductor element will next be explained.

Figure 2:
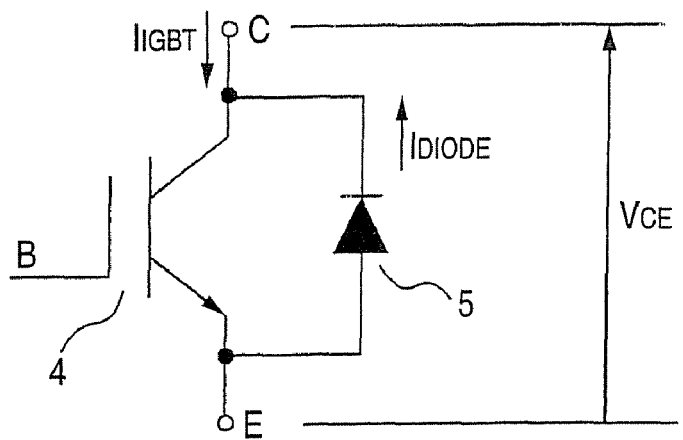
FIG. 2 shows a conceptual view of the base construction of one arm amount of a large electric power semiconductor element constituting the controller for a vehicle in the embodiment mode of this invention.

FIG. 2 is a conceptual view showing the basic construction of one arm of the large electric power semiconductor element constituting the above inverter device 1. As mentioned above, the large electric power semiconductor element is constructed by IGBT 4 and a diode 5. An electric current flowed to IGBT 4 is set to $I_{IGBT}$ and an electric current flowed to the diode 5 is set to $I_{DIODE}$. Further, the voltage between terminals of the large electric power semiconductor element is set to $V_{CE}$. Loss (heat consumption) is generated by flowing the electric current to IGBT 4 of the large electric power semiconductor element, or the diode 5.

Figure 3A:
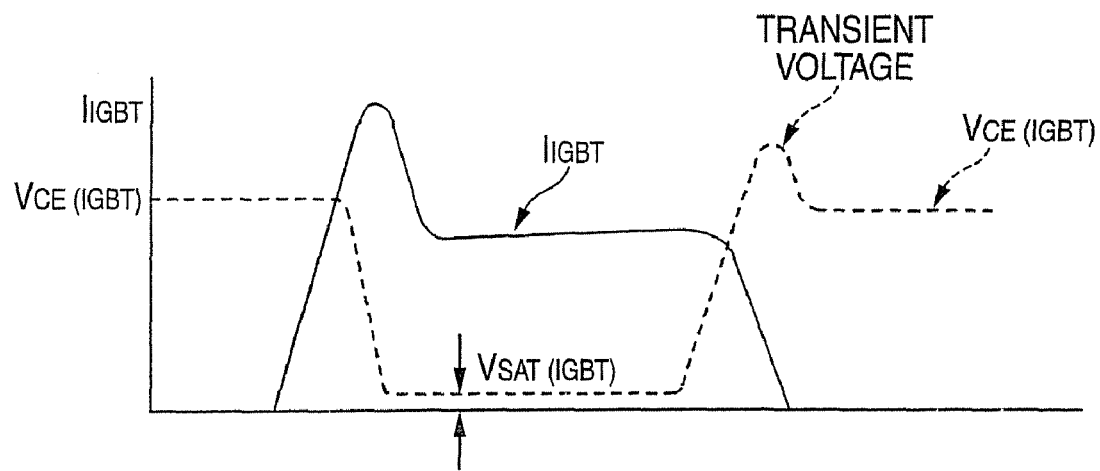
FIGS. 3A-3B is a view for explaining an electric current flowed to IGBT of the large electric power semiconductor element in accordance with the embodiment mode of this invention, its voltage and loss.
Figure 3B:
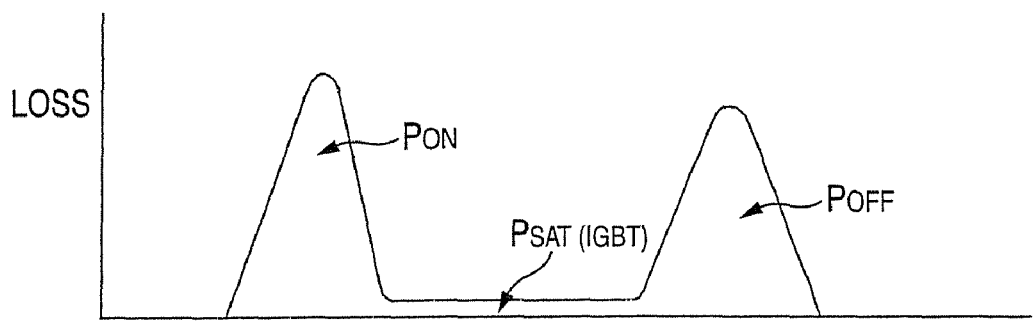

FIG. 3(a) shows the electric current $I_{IGBT}$ flowed to IGBT 4 and the voltage $V_{CE(IGBT)}$ between terminals of IGBT when IGBT 4 is turned on and off. A loss waveform as shown in FIG. 3(b) is obtained by multiplying the electric current $I_{IGBT}$ and the inter-terminal voltage $V_{CE(IGBT)}$. In this loss waveform, loss generated at the turning-on time of IGBT is called turn-on loss $P_{ON}$. When IGBT is switched in a saturation area, stationary loss $P_{SAT(IGBT)}$ is generated in IGBT. This stationary loss $P_{SAT(IGBT)}$ is generated by the electric current $I_{IGBT}$ flowed to IGBT and saturation voltage $V_{SAT(IGBT)}$ of IGBT. Further, when IGBT is turned off, a large spike voltage is generated with respect to the voltage $V_{CE(IGBT)}$ between both terminals of IGBT. Loss generated by this spike voltage is called turn-off loss $P_{OFF}$.

Figure 4A:
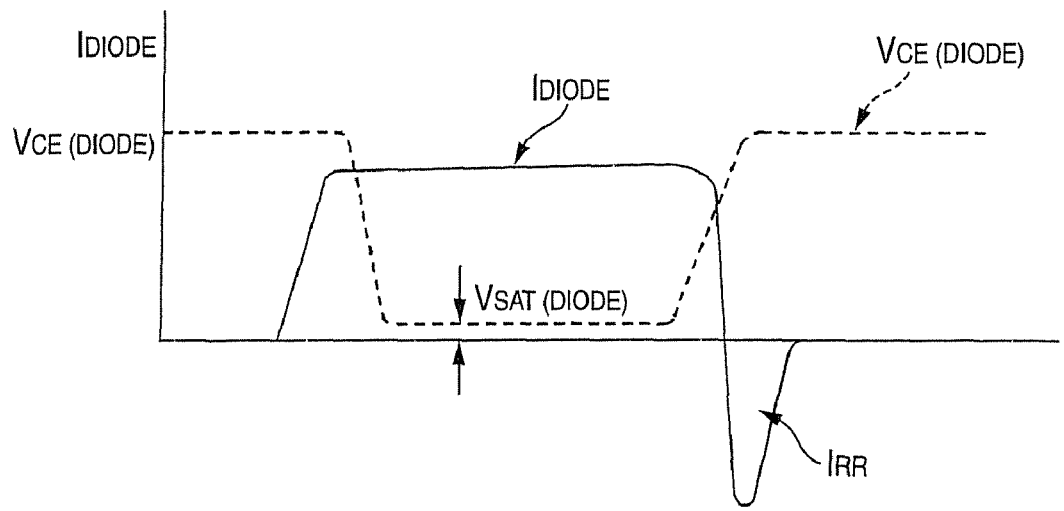
FIGS. 4A-4B is a view for explaining an electric current flowed to a diode of the large electric power semiconductor element in accordance with the embodiment mode of this invention, its voltage and loss.
Figure 4B:
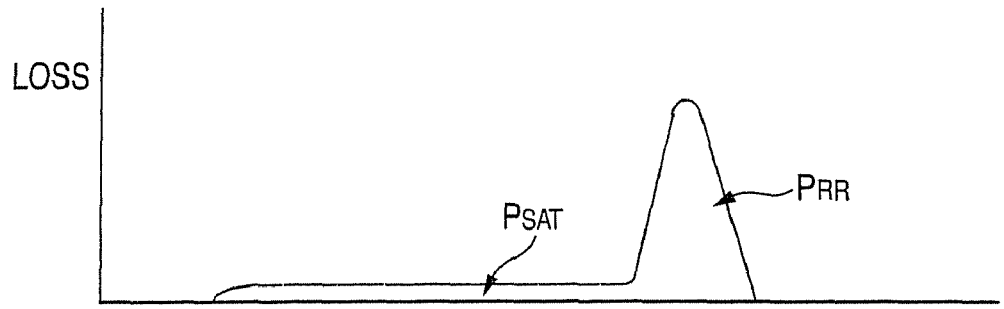

On the other hand, FIG. 4(a) shows the electric current $I_{DIODE}$ flowed to the diode and the voltage $V_{CE(DIODE)}$ between terminals of the diode when the diode is turned on and off. A loss waveform as shown in FIG. 4(b) is obtained by multiplying the electric current $I_{DIODE}$ and the inter-terminal voltage $V_{CE(DIODE)}$. As shown in FIGS. 4(a) and 4(b), when the diode is turned off, a large inverse electric current is flowed in a moment. This inverse electric current is called a recovery electric current $I_{RR}$, and loss generated at that time is called recovery loss $P_{RR}$. Similar to IGBT, stationary loss $P_{SAT}$ of the diode is generated by the electric current $I_{DIODE}$ flowed to the diode and saturation voltage $V_{SAT(DIODE)}$. As can be seen from above, when the electric current is flowed to IGBT in the semiconductor element for large electric power, turn-on loss $P_{ON}$, stationary loss $P_{SAT(IGBT)}$ and turn-off loss $P_{OFF}$ exist. When the electric current is flowed to the diode, stationary loss $P_{SAT}$ and recovery loss $P_{RR}$ exist.

Next, a calculating method of the above losses will be explained.

Figure 5:
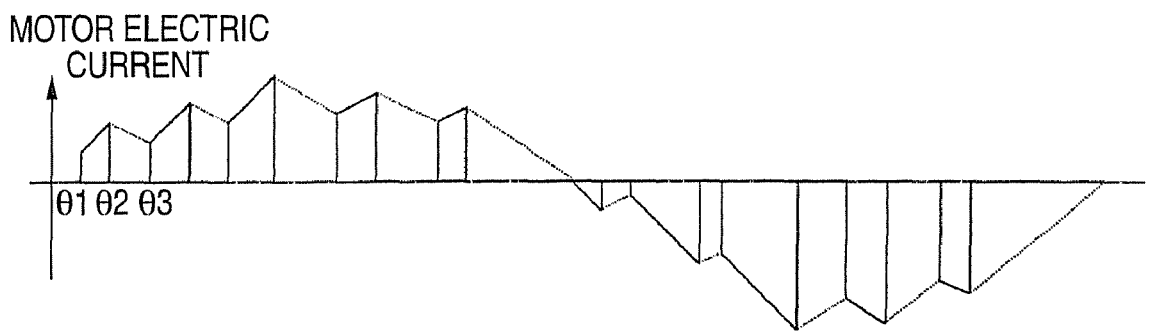
FIG. 5 is a view for explaining the electric current flowed to the large power semiconductor element in accordance with the embodiment mode of this invention.

As mentioned above, the electric current flowed to the electric motor is detected by the electric current detecting section 9, and the detected electric current value is inputted to the junction temperature calculating section 11. FIG. 5 shows one example of an electric current waveform detected by the electric current detecting section 9. FIG. 5 shows the waveform of only one phase, and three electric motor current signals ($I_U$, $I_V$, $I_W$) having phases different from each other every 120 degrees are respectively obtained by three electric current detecting sections. Further, the electric current and voltage waveforms of IGBT and the diode shown in FIGS. 3 and 4 are waveforms per one pulse.

In the controller for a vehicle, the output frequency Fsw of the controller for a vehicle is changed in accordance with the rotating speed of the electric motor. When the rotating speed of the electric motor is small, i.e., when the output frequency is small, the number of pulses becomes large. In contrast to this, when the rotating speed of the electric motor is large, i.e., when the output frequency is large, the number of pulses becomes small. FIG. 5 shows its one example, and shows a case of five pulses.

A solid line portion shown in FIG. 5 shows a state for flowing the electric current to IGBT, and a dotted line portion shows a state for flowing the electric current to the diode. Loss will be next calculated from an electric current signal obtained from the electric current detecting section 9.

Turn-On Loss of IGBT

A phase for turning-on IGBT is set to $\theta 1$ as shown in FIG. 5. The electric current at the phase $\theta 1$ time is obtained from the electric current detecting section 9, and its electric current is set to $I_{IGBT(\theta 1)}$. Further, the voltage of the filter capacitor at $\theta 1$ time is set to $E_{FC(\theta 1)}$, and this voltage is obtained from the voltage detecting section 8. The turn-on loss is calculated by the following formula from these obtained information.

$$P_{ON(IGBT)} = K_1 \times I_{IGBT(\theta 1)} \times E_{FC(\theta 1)}$$

$K_1$ shows information inputted to the junction calculating section in advance.

Calculation of Stationary Loss of IGBT

Figure 6:
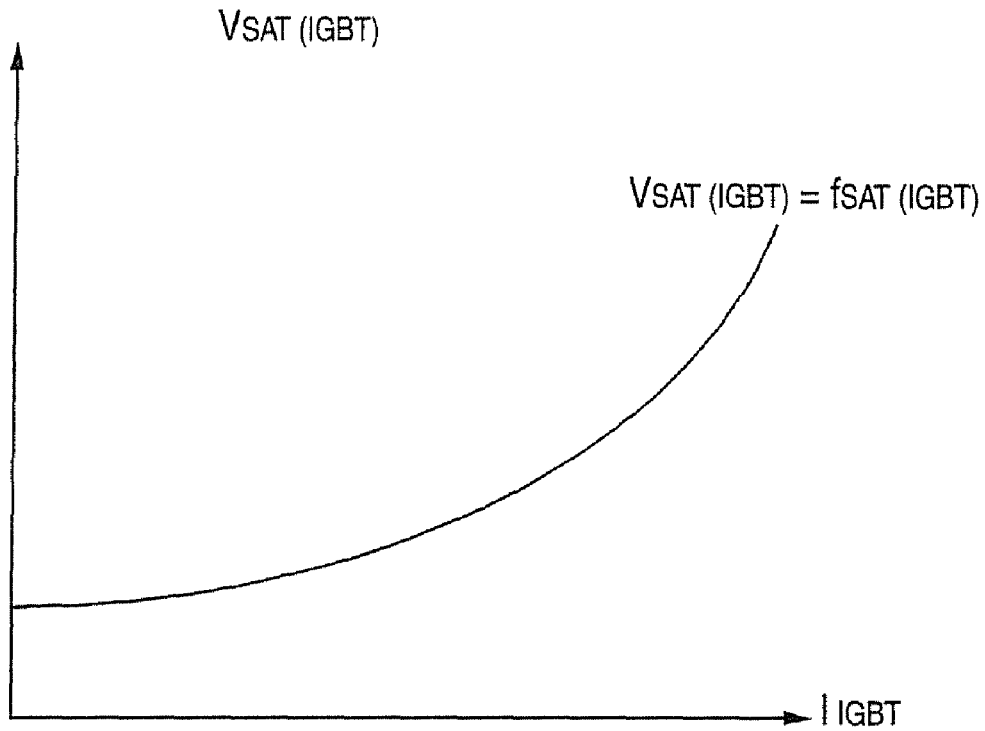
FIG. 6 is a view showing VSAT(IGBT) and IIGBT relating to the embodiment mode of this invention.

As shown in FIG. 5, the phase until IGBT is turned off is set to $\theta 2$. In the electric current detecting section 9, the electric current signal is sequentially obtained from $\theta 1$ to $\theta 2$, and its information is inputted to the junction temperature calculating section 11. In the junction temperature calculating section 11, as shown in FIG. 6, saturation voltage $V_{SAT(IGBT)}$ of IGBT is sequentially calculated in accordance with a function set in advance from this obtained electric current signal. This function is assembled into the junction temperature calculating section 11 in advance.

$$V_{SAT(IGBT)} = f_{SAT}(I_{IGBT})$$

Subsequently, the calculation shown by the following formula is performed by the junction temperature calculating section 11 to obtain stationary loss $P_{SAT(IGBT)}$ of IGBT.

$$P_{SAT(IGBT)} = \int_{\theta 1}^{\theta 2} I_{IGBT} \times V_{SAT(IGBT)} \cdot d\theta \quad \text{[Formula 1]}$$

Calculation of Turn-Off Loss of IGBT

As mentioned above, the phase until IGBT is turned off is set to $\theta 2$, and the electric current value obtained at that time is set to $I_{IGBT(\theta 2)}$. Further, the voltage of the filter capacitor at $\theta 2$ time is set to $E_{FC(\theta 2)}$ and this voltage is obtained from the voltage detecting section 8. The turn-on loss is calculated by the following formula from these obtained information.

$$P_{OFF(IGBT)} = K_2 \times I_{IGBT(\theta 2)} \times E_{FC(\theta 2)}$$

$K_2$ shows information inputted to the junction calculating section in advance.

Loss Per One Pulse of IGBT

As mentioned above, the turn-on loss, the stationary loss and the turn-off loss per one pulse of IGBT are obtained. Accordingly, the total loss per one pulse of IGBT is obtained from the following formula.

$$P_{IGBT(1Pulse)} = P_{ON(IGBT)} + P_{SAT(IGBT)} + P_{OFF(IGBT)}$$

Loss During One Period of IGBT

When the number of pulses during one period is N, the above technique is repeated N-times during one period. Accordingly, loss $P_{IGBT}$ generated in IGBT during one period is provided as follows.

$$P_{IGBT} = \sum_{k=1}^{N} P_{IGBT(kPulse)} \quad \text{[Formula 2]}$$

Calculation of Stationary Loss of Diode

An electric conducting period per one pulse of the diode is set to $\theta 2$ to $\theta 3$ as shown in FIG. 5. Further, the electric current flowed to the diode in this period is set to $I_{DIODE}$.

In the electric current detecting section 9, the electric current signal is sequentially obtained from $\theta 2$ time to $\theta 3$ time, and its information is inputted to the junction temperature calculating section 11. In the junction temperature calculating section 11, saturation voltage $V_{SAT(DIODE)}$ of the diode is sequentially calculated as shown in the following formula from this obtained electric current signal.

$$V_{SAT(DIODE)} = g_{SAT}(I_{DIODE})$$

Further, the calculation shown in the following formula is performed by the junction temperature calculating section 11, and stationary loss $P_{SAT(DIODE)}$ of the diode is obtained.

$$P_{SAT(DIODE)} = \int_{\theta 2}^{\theta 3} I_{DIODE} \times V_{SAT(DIODE)} \cdot d\theta \quad \text{[Formula 3]}$$

Calculation of Recovery Loss of Diode

Next, as mentioned above, a phase for turning-off the diode is set to $\theta 3$, and the electric current value obtained at that time is set to $I_{DIODE(\theta 3)}$, and the obtained electric current value $I_{DIODE(\theta 3)}$ is used. Further, the voltage of the filter capacitor at $\theta 3$ time is set to $E_{FC(\theta 3)}$, and this voltage is obtained from the voltage detecting section 8. The turn-on loss is calculated by the following formula from these obtained information.

$$P_{RR(DIODE)} = K_3 \times I_{DIODE(\theta 3)} \times E_{FC(\theta 3)}$$

$K_1$ shows information inputted to the junction calculating section in advance.

Loss Per One Pulse of Diode

The stationary loss and the recovery loss of the diode are obtained as mentioned above. Accordingly, the loss per one pulse of the diode is obtained by the following formula.

$$P_{DIODE(1Pulse)} = P_{SAT(DIODE)} + P_{RR(DIODE)}$$

Loss During One Period of Diode

When the number of pulses during one period is set to N, the above technique is repeated N-times during one period. Accordingly, loss $P_{DIODE}$ generated in the diode during one period is provided by the following formula.

$$P_{DIODE} = \sum_{k=1}^{N} P_{DIODE(kPulse)} \quad \text{[Formula 4]}$$

Calculation of Junction Temperature of IGBT

The junction temperature is calculated on the basis of the obtained loss. Here, when the loss of IGBT obtained by the above technique is set to $P_{IGBT}$ and the loss of the diode is set to $P_{DIODE}$, the loss P of the large electric power semiconductor element is obtained by the following formula.

$$P = P_{IGBT} + P_{DIODE}$$

Next, the junction temperatures of these IGBT and diode are calculated from the losses of IGBT constituting the above large electric power semiconductor element, and the diode.

Here, when the temperature difference from the junction of IGBT to a case is set to $\Delta T_{J\text{-}C(IGBT)}$, this temperature difference is calculated from the following formula.

$$\Delta T_{J\text{-}C(IGBT)} = P_{IGBT} \times R_{TH(J\text{-}C)IGBT}$$

Figure 7:
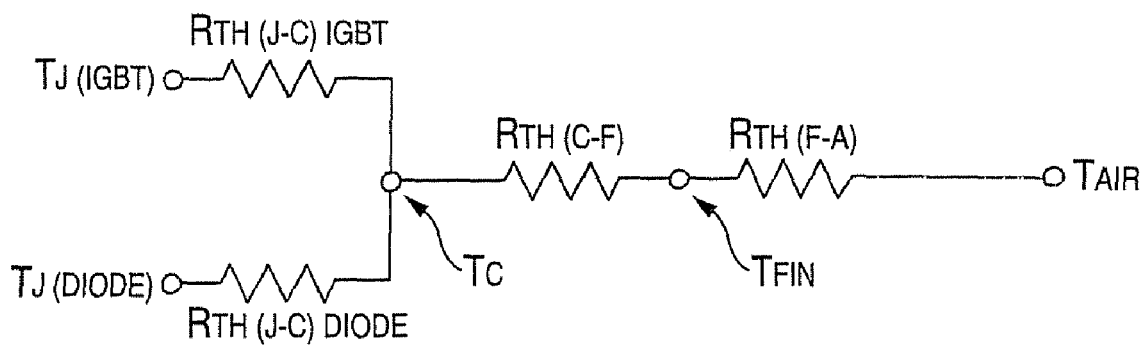
FIG. 7 is a distribution view of heat resistance for making a temperature calculation relating to the embodiment mode of this invention.

In this formula, $R_{TH(J\text{-}C)IGBT}$ is called thermal resistance, and is a characteristic value inherent to the element, and this numerical value is assembled into the junction temperature calculating section 11 in advance. FIG. 7 shows a distribution view of the thermal resistance for performing a temperature calculation.

Next, when the temperature difference from the case of the semiconductor element for large electric power to a cooling device is set to $\Delta T_{C\text{-}F}$, this temperature difference is shown by the following formula.

$$\Delta T_{C\text{-}F} = P \times R_{TH(C\text{-}F)}$$

Here, similar to the above description, $R_{TH(C\text{-}F)}$ is called thermal resistance, and is a numerical value inherent to the element. Further, this numerical value is also inputted to the junction temperature calculating section 11 in advance.

Further, temperature information of the cooling device is obtained from the temperature detecting section 10. The temperature of this cooling device is set to $T_{FIN}$.

The above junction temperature $T_{J(IGBT)}$ of IGBT is shown by the following formula from these calculations or the obtained information.

$$T_{J(IGBT)} = T_{FIN} + \Delta T_{C\text{-}F} + \Delta T_{J\text{-}C(IGBT)}$$

Junction Temperature of Diode

Subsequently, when the temperature difference from the junction of the diode to the case is set to $\Delta T_{J\text{-}C(DIODE)}$, this temperature difference is represented by the following formula.

$$\Delta T_{J\text{-}C(DIODE)} = P_{DIODE} \times R_{TH(J\text{-}C)DIODE}$$

Here, this $R_{TH(J\text{-}C)DIODE}$ is also called thermal resistance, and is a numerical value inherent to the semiconductor element for large electric power. Information of this thermal resistance is similarly assembled into the junction temperature calculating section 11 in advance.

Next, when the temperature difference from the case of the diode to the cooling device is set to $\Delta T_{C\text{-}F}$, this temperature difference is shown by the following formula.

$$\Delta T_{C\text{-}F} = P \times R_{TH(C\text{-}F)}$$

Further, temperature information from the temperature detecting section 10 to the cooling device is obtained. This temperature of the cooling device is set to $T_{FIN}$.

Accordingly, the junction temperature $T_{J(DIODE)}$ of the diode is shown as follows.

$$T_{J(DIODE)} = \Delta T_{J\text{-}C(DIODE)} + \Delta T_{C\text{-}F} + T_{FIN}$$

Thus, the junction temperatures of IGBT and the diode are obtained. Further, these calculations are made by a microprocessor.

Figure 8:
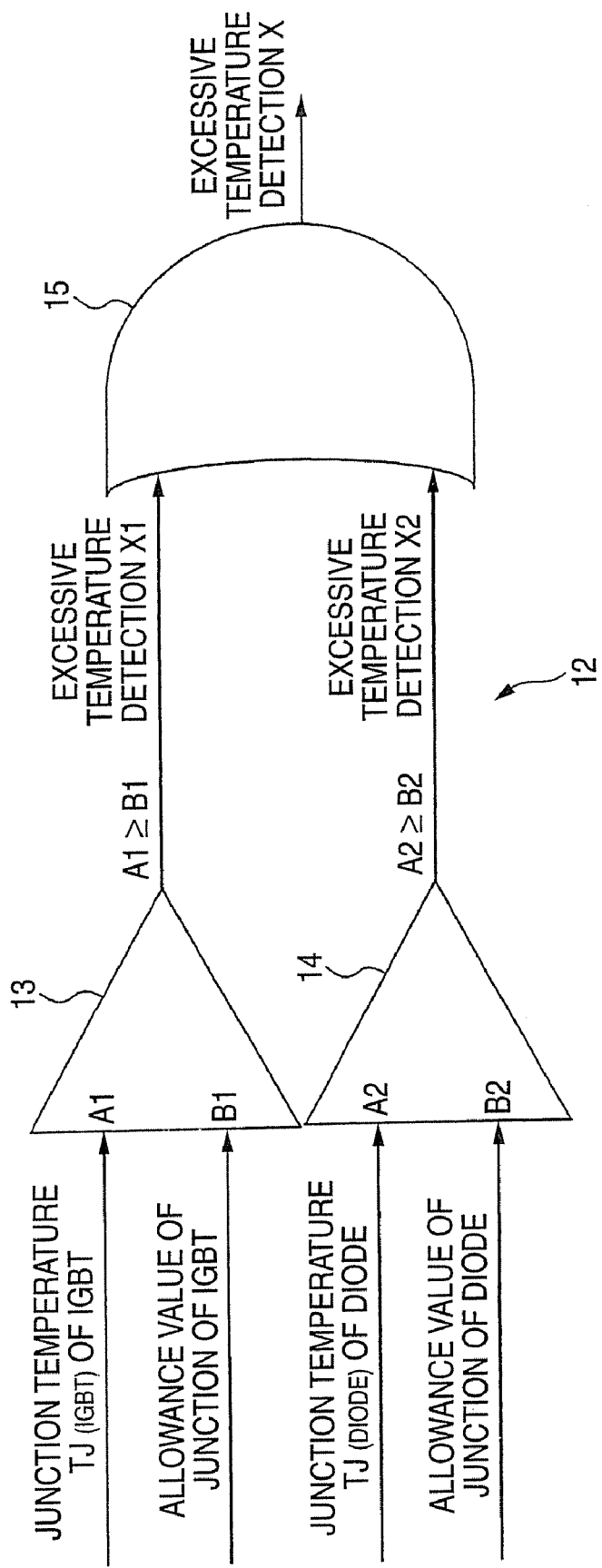
FIG. 8 is a block diagram for explaining the detailed construction of a comparing section relating to the embodiment mode of this invention.

FIG. 8 is a block diagram for explaining the detailed construction of the comparing section 12. As mentioned above, information obtained in the junction temperature calculating section 11 is inputted to the comparing section 12. In this comparing section 12, the obtained junction temperature and an allowable value are compared. This comparing section 12 has a comparator 13, a comparator 14 and an OR gate 15. Junction temperature $T_{J(IGBT)}$ of IGBT is set to A1, and the allowable value of the junction temperature of IGBT is set to B1, and this junction temperature and this allowable value are respectively inputted to the comparator 13. Junction temperature $T_{J(DIODE)}$ of the diode is set to A2, and the allowable value of the junction temperature of the diode is set to B2, and this junction temperature and this allowable value are respectively inputted to the comparator 14. Respective outputs of these comparators 13, 14 are inputted to the OR gate 15.

As shown in FIG. 8, in the comparator 13, the junction temperature A1 of IGBT and the allowable value B1 of the junction temperature of IGBT are compared. When A1 is B1 or more, it is judged as excessive temperature detection X1. On the other hand, in the comparator 14, the junction temperature A2 of the diode and the allowable value B2 of the junction temperature of the diode are compared. When A2 is B2 or more, it is judged as excessive temperature detection X2.

When one of the above excessive temperature detections X1 and X2 is performed, the excessive temperature detection X is outputted from the OR gate 15 as an output of the comparing section 12. Namely, when the excessive temperature is detected in one of IGBT and the diode, it is attained that the semiconductor element for large electric power detects the excessive temperature.

Figure 9:
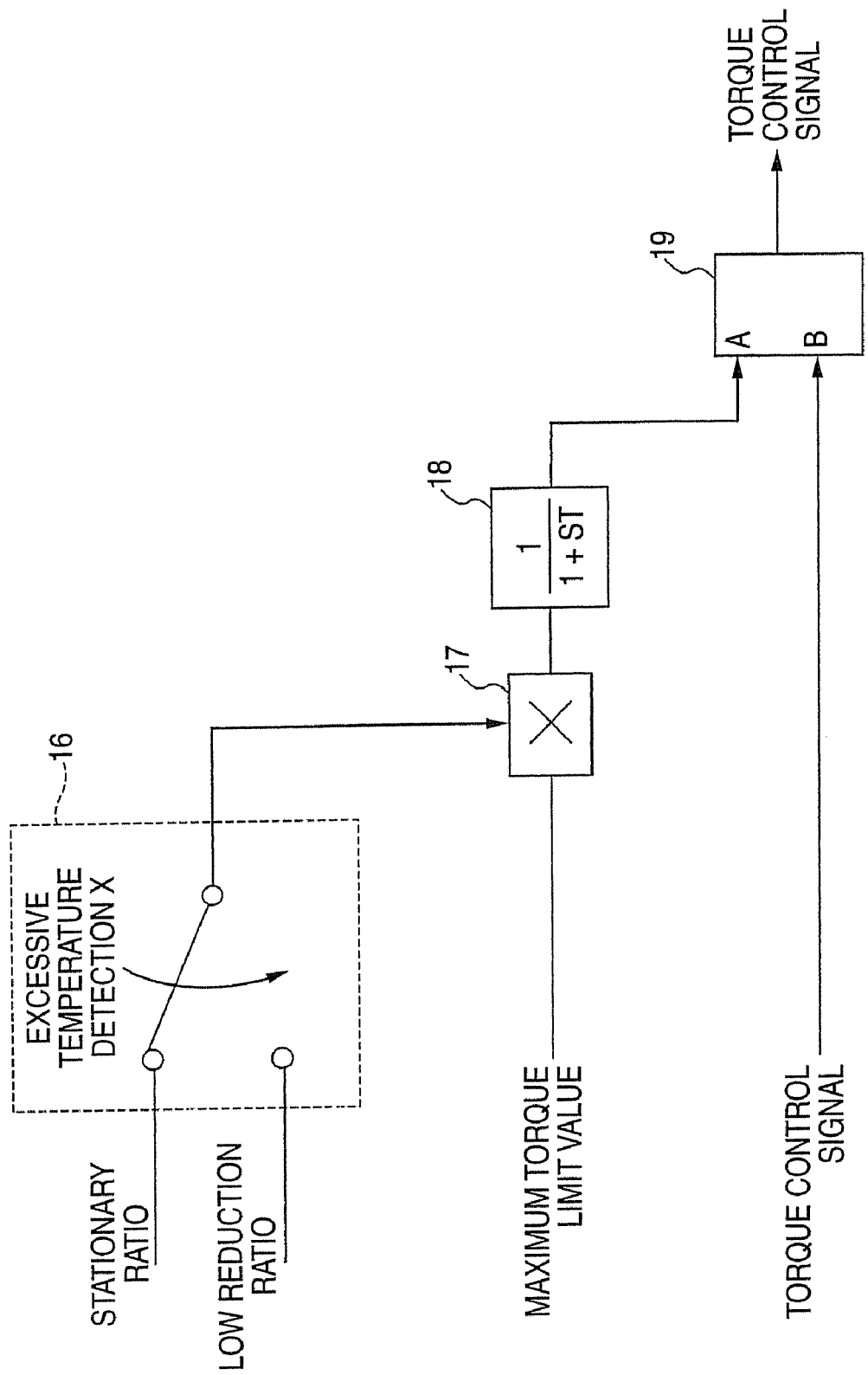
FIG. 9 is a block diagram for explaining the detailed construction of a driving control section relating to the embodiment mode of this invention.
Figure 10:
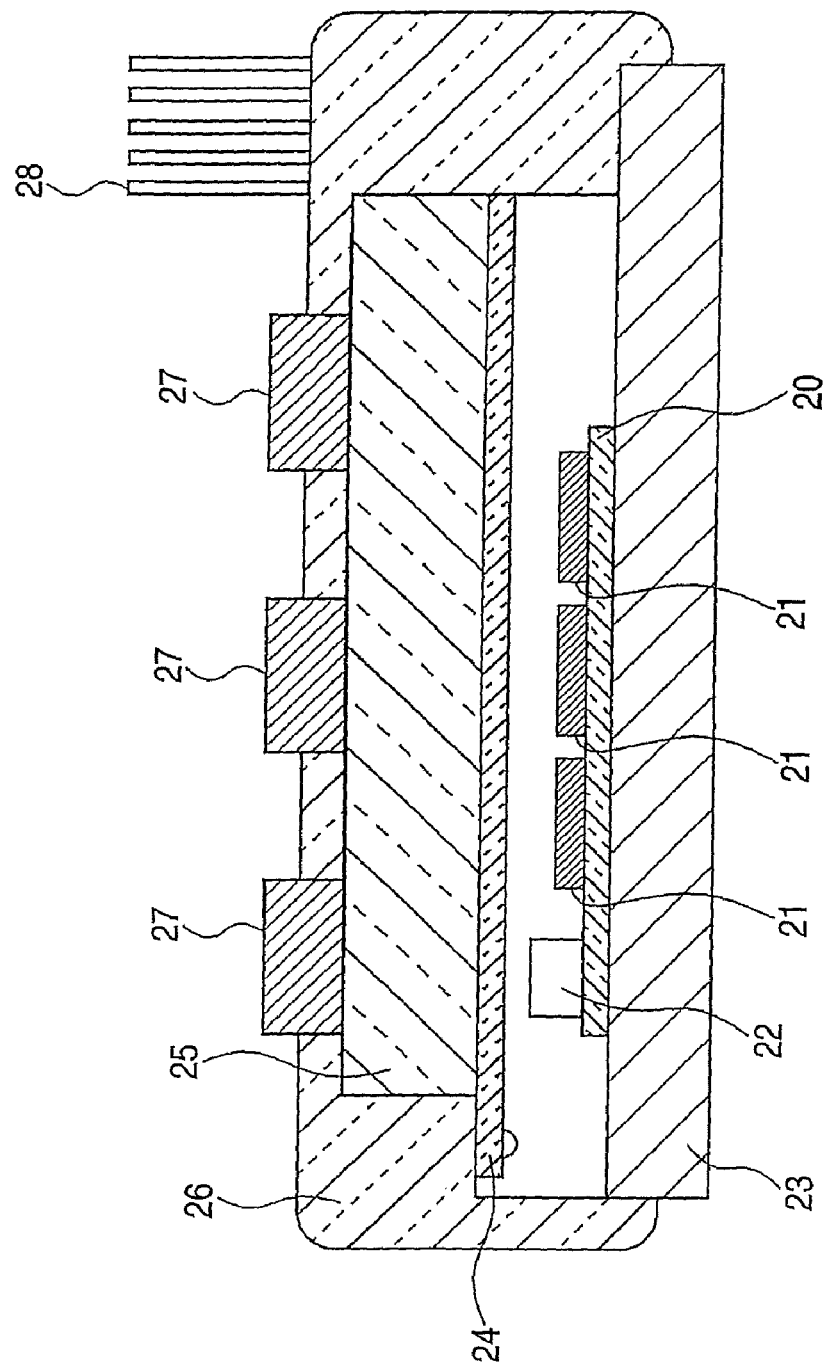
FIG. 10 is a view showing the internal structure of a conventional intelligent power module (IPM).

FIG. 9 is a block diagram for explaining the detailed construction of the driving control section 7. As mentioned above, it shows a case in which the detecting result of the excessive temperature is utilized in an output torque limit operation of the electric motor 3. In FIG. 9, reference numeral 16 designates a switch for changing a constant ratio multiplied by a maximum torque command value in case where the excessive temperature is detected. This switch 16 switches this constant ratio from a stationary ratio to a reduction ratio in accordance with an input signal of the excessive temperature detection X. The reduction ratio is a value smaller than 1 in the ratio with respect to the stationary ratio. This reduction ratio is multiplied by a maximum torque limit value in a multiplier 17, and is inputted to a comparing section 19 through a primary delay element 18.

In the comparing section 19, a signal inputted through the above primary delay element 18 and the torque command value are compared, and a smaller one of these two inputs is outputted. This output is a torque control signal. The output torque of the electric motor 3 is controlled so as to be restrained by inputting this signal to IGBT of the inverter device 1 as a control signal.

In the primary delay element 18, a torque value is lowered by detecting the excessive temperature, and it is returned to the stationary ratio when no excessive temperature is detected. However, when it is instantly returned to the stationary ratio, there is a possibility that a transient electric current is flowed to the electric motor 3, and the semiconductor element for large electric power is broken by this transient electric current.

The above primary delay element 18 is inserted to prevent the torque value from being instantly transferred in this way, and prevent the breakdown of the semiconductor element for large electric power.

In the above FIG. 9, the explanation has been made with respect to the example in which the switching of the semiconductor element for large electric power is controlled so as to reduce the output torque with respect to the detecting result of the excessive temperature. However, the present invention is not limited to this case, but can be also set to control for improving a switching speed with respect to the detecting result of the excessive temperature, and includes all other application examples.

The invention claimed is:

1. An excessive temperature detecting system of an electric motor controller comprising an inverter device for controlling driving electric power supplied to a motor arranged in a vehicle by controlling a semiconductor element for large electric power; a voltage detecting section for detecting the voltage of a filter capacitor inserted on a direct current side of said inverter device; an electric current detecting section for detecting an output electric current of said inverter device; a temperature detecting section arranged in cooling means of said semiconductor element; a junction temperature calculating section for sequentially calculating loss caused by a switching operation of said semiconductor element by a detecting signal from each of said detecting sections, and calculating junction temperature of said semiconductor element on the basis of the calculated loss value; and a comparing section for generating an excessive temperature detecting output when an output of said junction temperature calculating section reaches a predetermined allowable temperature.

2. The excessive temperature detecting system of the electric motor controller according to claim 1, wherein the calculation of the loss using said junction temperature calculating section is performed by an adding calculation which is added up by an integrating calculation per pulse of turn-on loss, stationary loss and turn-off loss in a case for flowing the electric current to a switching element constituting said semiconductor element, and an integrating calculation per pulse of stationary loss and recovery loss in a case for flowing the electric current to a diode.

3. The excessive temperature detecting system of the electric motor controller according to claim 2, wherein the junction temperature in said junction temperature calculating section is obtained by deriving a temperature difference from a junction of said semiconductor element for large electric power to said temperature detecting section by using a thermal resistance value from the junction of said semiconductor element to said temperature detecting section, and said calculated loss value.

4. The excessive temperature detecting system of the electric motor controller according to claim 2, wherein said comparing section is constructed by a first comparator for detecting excessive temperature of said switching element; a second comparator for detecting excessive temperature of said diode; and an OR gate for detecting the excessive temperature of one of said first comparator and the second comparator, and setting the detected excessive temperature to the excessive temperature detecting output.

5. The excessive temperature detecting system of the electric motor controller according to claim 4, wherein the excessive temperature detecting system further comprises a driving control section for controlling the switching of said semiconductor element for large electric power so as to limit output torque of the motor by said excessive temperature detecting output.

* * * * *